(12) United States Patent
Lin

(10) Patent No.: US 9,153,312 B2
(45) Date of Patent: Oct. 6, 2015

(54) METHODS AND APPARATUSES INCLUDING TRANSMITTER CIRCUITS

(71) Applicant: Micron Technology, Inc., Boise, ID (US)

(72) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 13/975,128

(22) Filed: Aug. 23, 2013

(65) Prior Publication Data

US 2015/0055431 A1    Feb. 26, 2015

(51) Int. Cl.
| | |
|---|---|
| G11C 8/00 | (2006.01) |
| G11C 11/408 | (2006.01) |
| H04L 25/00 | (2006.01) |
| G11C 7/02 | (2006.01) |
| G11C 7/10 | (2006.01) |

(52) U.S. Cl.
CPC .............. G11C 11/4085 (2013.01); G11C 7/02 (2013.01); G11C 7/1069 (2013.01); G11C 7/1096 (2013.01); H04L 25/00 (2013.01)

(58) Field of Classification Search
CPC ........... G11C 8/10; G11C 8/08; G11C 7/1051
USPC ........................................ 365/230.06, 189.05
See application file for complete search history.

(56) References Cited

U.S. PATENT DOCUMENTS

| | | | |
|---|---|---|---|
| 7,714,617 B2 | 5/2010 | Lee | |
| 8,022,729 B2 | 9/2011 | Lee | |
| 8,031,802 B2 * | 10/2011 | Abbasfar et al. | 375/295 |
| 2013/0229848 A1 * | 9/2013 | Vogelsang | 365/63 |
| 2013/0257489 A1 | 10/2013 | Lin | |
| 2013/0346663 A1 * | 12/2013 | Tell | 710/305 |
| 2014/0313844 A1 | 10/2014 | Lin | |

OTHER PUBLICATIONS

Kho, et al., "A 75 nm 7 Gb/s/pin 1 Gb GDDR5 Graphics Memory Device With Bandwidth Improvement Techniques", IEEE Journal of Solid-State Circuits, vol. 45, No. 1, Jan. 2010, 120-133.

* cited by examiner

Primary Examiner — Huan Hoang
(74) Attorney, Agent, or Firm — Dorsey & Whitney LLP

(57) ABSTRACT

Methods and apparatuses are disclosed for transmitter circuits. One example apparatus includes a pre-driver circuit configured to provide a transition control signal responsive to received data, and a main driver circuit configured to drive an output node responsive to the transition control signal. The apparatus also includes a feedback circuit configured to provide a feedback control signal responsive to a voltage of the output node reaching or exceeding a predefined threshold, and an equalizer driver circuit configured to assist the main driver circuit in driving the output node responsive to signals from at least one of the pre-driver circuit and the feedback circuit.

18 Claims, 7 Drawing Sheets

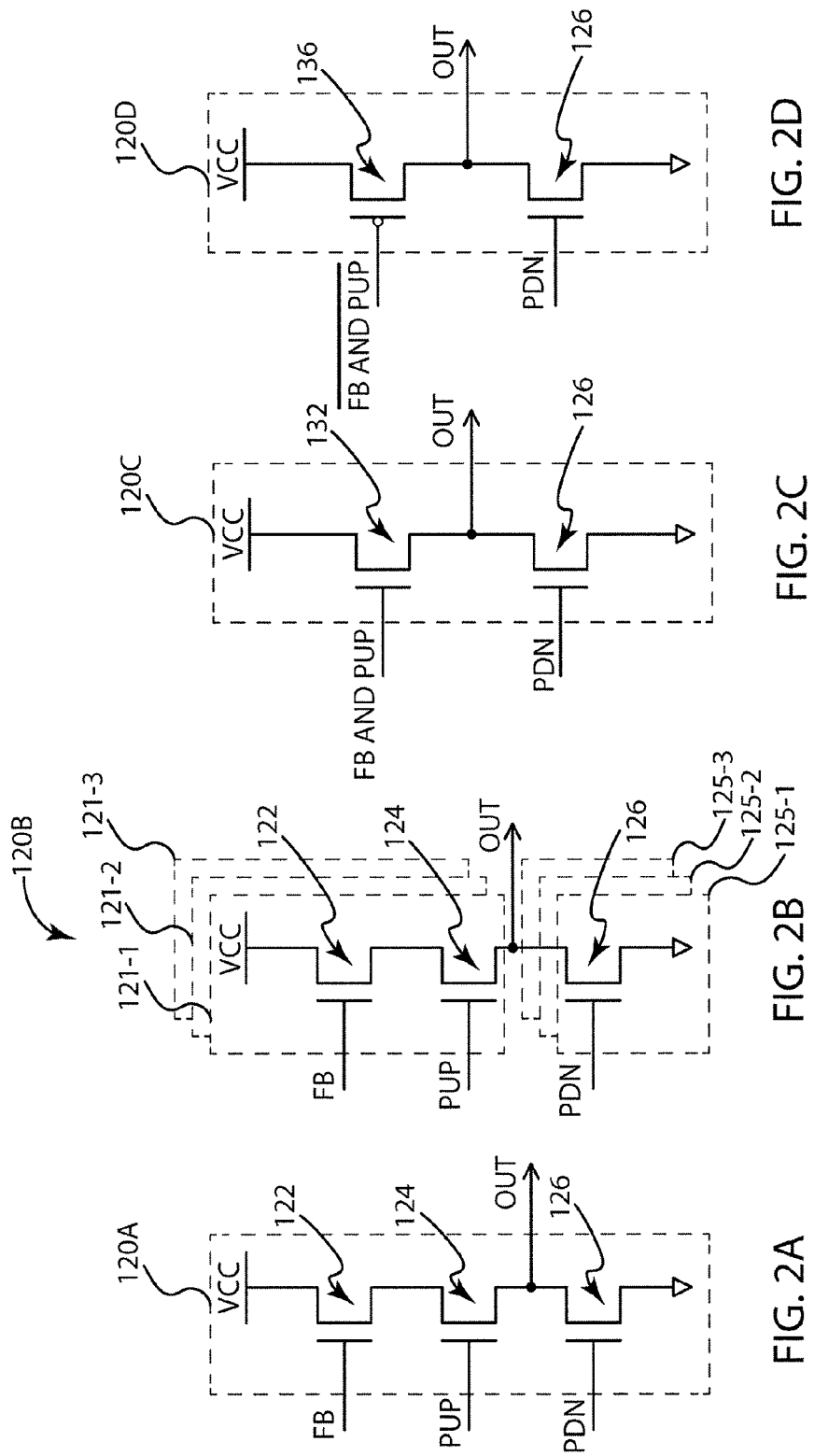

METHODS AND APPARATUSES INCLUDING TRANSMITTER CIRCUITS

BACKGROUND OF THE INVENTION

When data is transmitted through a channel, such as a metal wire or a through-silicon-via (TSV), the channel may distort the data as it passes through the channel. For example, the channel may filter out high frequency components of a digital data signal, thereby reducing the "sharpness" of transitions, increasing inter-symbol interference, decreasing the time the data of the signal is valid, and so forth.

Various techniques exist to compensate for the distortion caused by the channel, either before the data is transmitted on the transmitter side of the channel, or after it is received on the receiver side of the channel. As one example, an equalizer circuit may be used on the transmitter side to "pre-emphasize" data transitions in a digital data signal before it is transmitted through the channel. Such equalization typically aims to boost the voltage and/or current provided to the channel in order to compensate for high frequency losses of the channel. However, many such equalization circuits need dedicated control circuitry, including for example an edge detector, in order to be able to effectively pre-emphasize the data transitions.

BRIEF DESCRIPTION OF THE DRAWINGS

FIG. 2A is a simplified schematic diagram of a main driver circuit for a transmitter circuit according to an embodiment of the present invention.

FIG. 2B is a simplified schematic diagram of a main driver circuit for a transmitter circuit according to an embodiment of the present invention.

FIG. 2C is a simplified schematic diagram of a main driver circuit for a transmitter circuit according to an embodiment of the present invention.

FIG. 2D is a simplified schematic diagram of a main driver circuit for a transmitter circuit according to an embodiment of the present invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
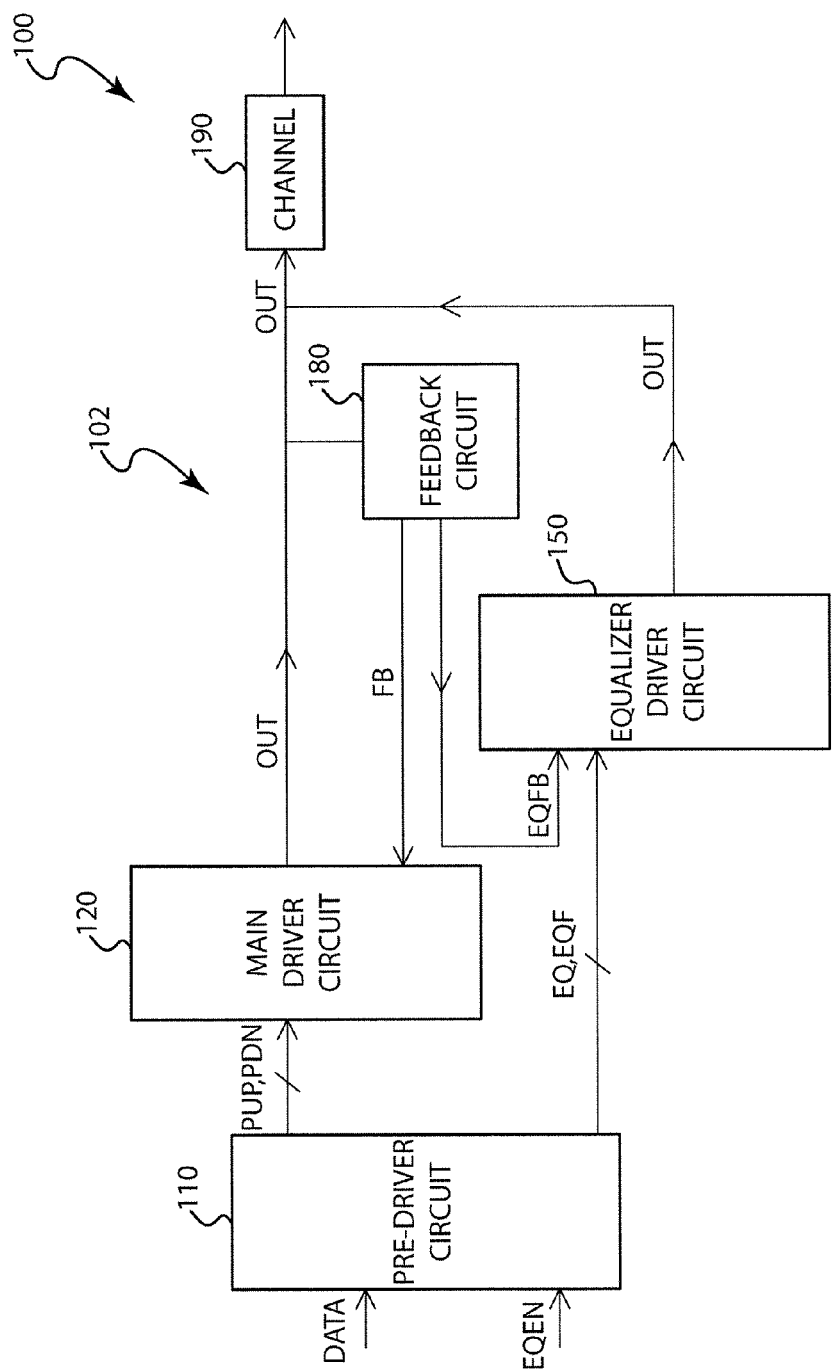
FIG. 1 is a block diagram of an apparatus with a transmitter circuit according to an embodiment of the present invention.

FIG. 1 illustrates an apparatus 100 with a transmitter circuit 102 according to an embodiment of the invention. As used herein, apparatus may refer to, for example, an integrated circuit, a memory device, a memory system, an electronic device or system, a smart phone, a tablet, a computer, a server, etc. The transmitter circuit 102 includes a pre-driver circuit 110, which receives an input signal DATA from, for example, a memory array. In other examples, the input signal DATA may include a command, an address, and so forth. The pre-driver circuit 110 may also in some embodiments receive an equalizer enable signal EQEN. In response to the input signal DATA and, in some embodiments, the equalizer enable signal EQEN, the pre-driver circuit 110 provides one or more transition control signals PUP, PDN to a main driver circuit 120. Responsive to the input data signal DATA and, in some embodiments, the equalizer enable signal EQEN, the pre-driver circuit 110 also provides one or more transition control signals EQ, EQF to an equalizer driver circuit 150. In some examples, the transition control signals PUP, EQF may be identical as generated by the pre-driver circuit 110, and the transition control signals PDN, EQ may be identical as generated by the pre-driver circuit 110. However, due to different placement locations of the main driver circuit 120 and the equalizer driver circuit 150, and different signal paths from the pre-driver circuit 110 to the main driver circuit 120 as compared with the signal path from the pre-driver circuit 110 to the equalizer driver circuit 150, the transition control signals EQ, EQF received by the equalizer driver circuit 150 may be slightly different (e.g., out of phase, distorted, etc.) than the transition control signals PUP, PDN received by the main driver circuit 120. In other examples, the transition control signals PUP, EQF and PDN, EQ may be different from one another—for example the pre-driver circuit 110 may generate the transition control signal EQF as the inverse of the transition control signal PUP. In still other embodiments, the transition control signals PUP, PDN, EQ, EQF may not be so related.

The main driver circuit 120 receives the transition control signals PUP, PDN from the pre-driver circuit 110, and, in response, drives the output node OUT, in order to transmit data through a channel 190. The channel 190 may be, for example, a metal wire, one or more through-silicon-vias (TSVs), any type of transmission line, and so forth. As mentioned above, the channel 190 may distort signals transmitted therethrough.

In addition to the transition control signals PUP, PDN, the main driver circuit 120 also receives at least one feedback control signal FB from a feedback circuit 180. The feedback control signal FB may be provided by the feedback circuit 180 responsive to a voltage of the output node OUT—for example, the feedback control signal may be provided as a logic high when the voltage of the output node OUT reaches or exceeds a threshold (which may be predefined, may be determined dynamically, etc.). The feedback circuit 180 may, in some examples, include a feedback amplifier, a delay element, and so forth. In one example, the feedback circuit 180 is controlled by a biasing voltage in order to control the swing of the voltage driven onto the output node OUT. The feedback circuit 180 may provide the feedback control signal FB such that the main driver circuit 120 only drives the output node OUT to a fraction of the voltage supply VCC, with the fraction determined by a delay introduced by the feedback circuit

180. If, for example, the voltage supply VCC is 1.2 volts, the feedback circuit 180 may limit the main driver circuit 120 to only drive the voltage of the output node OUT between ground (0 volts) and 0.2 volts. In this manner, the feedback control signal FB may act to disable the main driver circuit 120 once the voltage of the output node OUT reaches or exceeds the threshold.

As illustrated in FIG. 1, the feedback circuit 180 may also provide another, second feedback control signal EQFB to the equalizer circuit 150. In some embodiments, the second feedback control signal EQFB may be provided by the feedback circuit 180 as the inverse of the first feedback control signal FB, or it may be provided as the same as the first feedback control signal FB in other embodiments. Thus in some embodiments, the second feedback control signal EQFB may be provided responsive to the first feedback control signal FB, whereas in other embodiments the first and second feedback control signals FB and EQFB may be unrelated.

The equalizer driver circuit 150 is coupled to the pre-driver circuit 110, the feedback circuit 180, and the output node OUT, and is configured to assist the main driver circuit 120 in driving the output node OUT responsive to signals EQ, EQF, EQFB received from the pre-driver circuit 110 and the feedback circuit 180. The equalizer driver circuit 150 may have a drive strength that is weaker than the drive strength of the main driver circuit 120—for example the equalizer driver circuit 150 may have a drive strength that is no greater than 20% of that of the main driver circuit 120. In this manner, the equalizer driver circuit 150 may pre-emphasize the data to be provided to the output node OUT and the channel 190 in order to compensate for distortions that may be introduced by the channel. The equalizer driver circuit 150 compensates for such transmission effects by boosting the voltage and/or current (whether positive or negative) provided to the output node OUT by the main driver circuit 120 during signal transitions. By providing additional current to the output node OUT during one or more data transitions, the equalizer driver circuit 150 may increase the "sharpness" of the data transitions, and thereby offset the distortions that will be introduced by the channel 190. In some embodiments, the equalizer driver circuit 150 is only active during the transitions of the voltage of the output node OUT, thus reducing the power consumed by the equalizer driver circuit 150.

As illustrated in FIG. 1, the equalizer driver circuit 150 may be controlled by signals EQ, EQF, EQFB provided by the pre-driver circuit 110 and the feedback control circuit 180, and thus no separate edge detector or other control circuitry may be needed to operate the equalizer driver circuit 150. For example, the equalizer driver circuit 150 uses information such as the overlap between the second feedback control signal EQFB and the transition control signals EQ, EQF in order to determine when the voltage of the output node OUT transitions and, in response, to boost these transitions. In other words, the equalizer driver circuit 150 uses control signals that may be used in controlling the main driver circuit 120 to assist the main driver circuit 120 in driving the output node OUT. By assisting the main driver circuit 120 in driving the output node OUT, the equalizer driver circuit 150 may, in some embodiments, increase the swing of the output node OUT voltage, which may improve slew rate and lengthen the time data transmitted through the channel 190 may be valid.

As previously mentioned, the transition control signals EQ, EQF provided by the pre-driver circuit 110 to the equalizer driver circuit 150 may in some embodiments depend on an equalizer enable signal EQEN provided to the pre-driver circuit 110. For example, when an equalizer enable signal EQEN is provided to the pre-driver circuit 110 as a logic high, the pre-driver circuit 110 may provide the transition control signals EQ, EQF as logic low. This may in turn disable the equalizer driver circuit 150. In this manner, the equalizer driver circuit 150 can be disabled in order to conserve power when, for example, a relatively low frequency is used for data transmission through the channel 190, and enabled when, for example, a relatively high frequency is used for data transmission through the channel 190.

Turning now to FIG. 2A, one example 120A of a main driver circuit 120 for use in the transmitter circuit 102 of FIG. 1 is illustrated, according to an embodiment of the invention. The main driver circuit 120A in FIG. 2A includes a pull-up network and a pull-down network. The pull-up network includes two n-channel field effect transistors (nFETs) 122, 124 coupled in series between a voltage supply node VCC and the output node OUT, and the pull-down network includes an nFET 126 coupled between the output node OUT and a reference voltage node, such as ground. The first nFET 122 in the pull-up network receives the first feedback control signal FB from the feedback circuit 180, the second nFET 124 in the pull-up network receives the transition control signal PUP from the pre-driver circuit 110, and the nFET 126 in the pull-down network receives the transition control signal PDN from the pre-driver circuit 110. In response to the first feedback control signal FB and the transition control signals PUP, PDN, the main driver circuit 120A in FIG. 2A drives the output node OUT.

The pull-up network of the main driver circuit 120A in FIG. 2A will be active when both the first feedback signal FB and the transition control signal PUP are provided as logic high. This overlap of the first feedback signal FB and the transition control signal PUP thus determines how high the voltage of the output node OUT will be driven by the pull up network—i.e., the overlap determines an upper limit of the voltage swing of the output node OUT. Thus, the main driver circuit 120 in FIG. 2A is one example of a ground-referenced, small swing driver circuit that may be used to reduce power consumption in a transmitter circuit 102 by reducing the voltage swing of the output node OUT from, for example 1.2 volts to about 0.2 volts. As used herein, "small swing driver circuit" refers to a driver circuit configured to drive a node to only a fraction of a voltage supply, such as VCC.

FIG. 2B illustrates another example 120B of a main driver circuit 120 for use in the transmitter circuit 102 of FIG. 1, according to an embodiment of the invention. The embodiment 120B of the main driver circuit illustrated in FIG. 2B is similar to the embodiment 120A illustrated in FIG. 2A, except that a plurality of pull-up networks 121-1, 121-2, 121-3 and a plurality of pull-down networks 125-1, 125-2, 125-3 are used in order to increase the overall drive strength of the main driver circuit 120B. Segmenting the pull-up and pull-down networks in this manner may reduce the overall power consumption, reduce the likelihood of a large power spike, improve the slew rate of signal transitions, and so forth. As illustrated in FIG. 2B, the pull-up networks 121-1, 121-2, 121-3 may receive the same control signals FB, PUP, and the pull-down networks 125-1, 125-2, 125-3 may receive the same control signal PDN. In another embodiment, however, the transition control signals PUP and/or PDN may be provided to the pull-up networks 121-1, 121-2, 121-3 and the pull-down networks 125-1, 125-2, 125-3 with slightly different timing delays in order to stagger the output enabling and provide a smoother transition of the output (e.g., to avoid a large current spike).

FIG. 2C illustrates another example 102C of a main driver circuit 120 for use in the transmitter circuit 102 of FIG. 1, according to an embodiment of the invention. The embodiment 120C of the main driver circuit illustrated in FIG. 2C is similar to the embodiment 120A illustrated in FIG. 2A, except that the pull-up network of the embodiment 120C in FIG. 2C has an nFET 132, which receives the logical AND of the first feedback control signal FB and the transition control signal PUP. As one example of implementation, and with reference back to FIG. 1, the feedback circuit 180 may receive the transition control signal PUP from the pre-driver circuit 110 and include circuitry to combine the transition control signal PUP and the feedback control signal FB, or vice versa.

FIG. 2D illustrates another example 102D of a main driver circuit 120 for use in the transmitter circuit 102 of FIG. 1, according to an embodiment of the invention. The embodiment 102D of the main driver circuit illustrated in FIG. 2D is similar to the embodiment 120C illustrated in FIG. 2C, except that the nFET 132 has been replaced with a p-channel field effect transistor (pFET) 136, and, the combined feedback and transition control signal (e.g., the logical AND of the FB signal and the PUP signal) has been inverted.

Figure 3B:
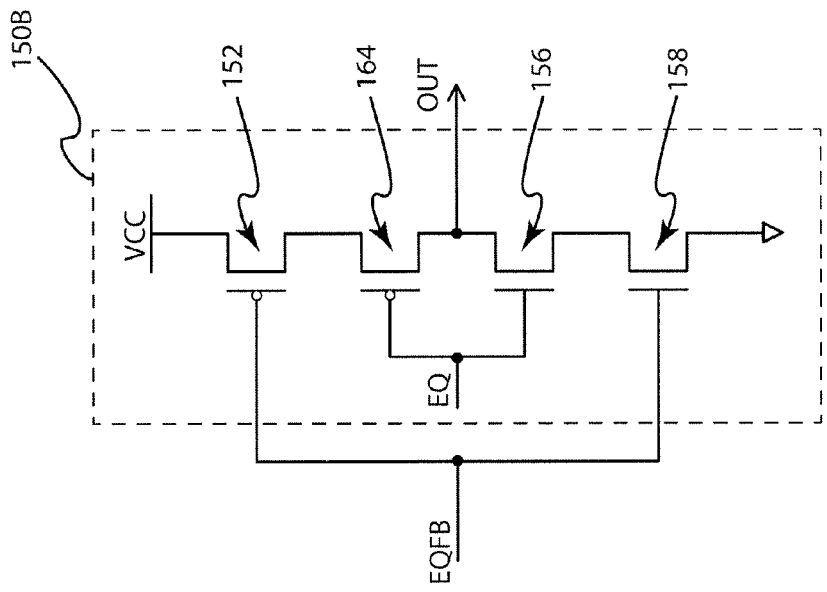
FIG. 3B is a simplified schematic diagram of an equalizer circuit for a transmitter circuit according to an embodiment of the present invention.
Figure 3A:
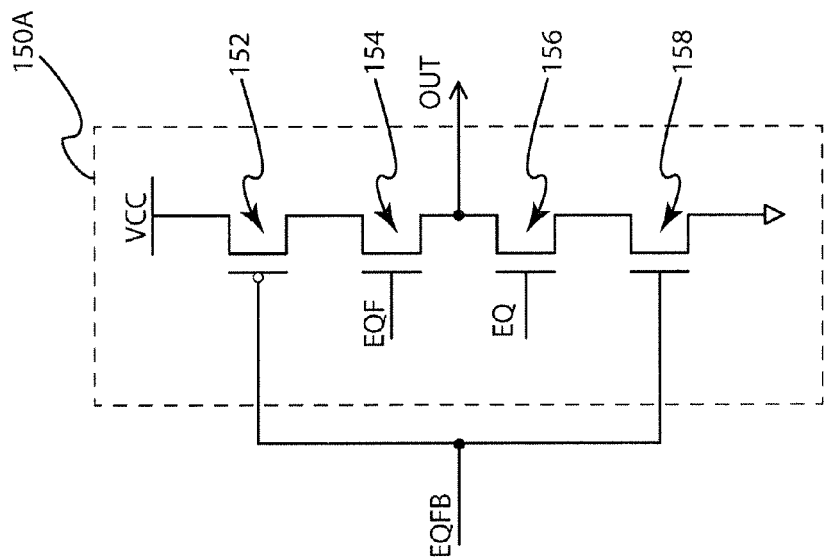
FIG. 3A is a simplified schematic diagram of an equalizer circuit for a transmitter circuit according to an embodiment of the present invention.

FIG. 3A illustrates one example 150A of an equalizer driver circuit 150 for use in the transmitter circuit 102 of FIG. 1, according to an embodiment of the invention. As illustrated in FIG. 3A, the equalizer driver circuit 150A includes a pull-up network with a pFET 0.152 and an nFET 154 coupled in series between a voltage supply node such as VCC and the output node OUT. The equalizer driver circuit 150A also includes a pull-down network with two nFETs 156, 158 coupled in series between the output node OUT and a reference voltage node, such as ground. The pFET 152 and the nFET 158 both receive the second feedback control signal EQFB from the feedback circuit 180, whereas nFET 154 receives transition control signal EQF from the pre-driver circuit 110 and nFET 156 receives transition control signal EQ from the pre-driver circuit 110.

In operation, the pFET 152 and nFET 154 will activate the pull-up network responsive to the second feedback control signal EQFB being provided as a logic low and the transition control signal EQF being provided as logic high, whereas nFETs 156, 158 will activate the pull-down network responsive to the second feedback control signal EQFB and the transition control signal EQ both being provided as logic high. In other words, the overlap between the second feedback control signal EQFB and the transition control signals EQ, EQF control when the equalizer driver circuit 150A is actively boosting the transition of signals on the output node OUT. In some embodiments, the overlap of the second feedback control signal EQFB and the transition control signals EQ, EQF may be substantially similar to the overlap of the first feedback control signal FB and the transition control signals PUP, PDN, thus causing the main driver circuit 120 and the equalizer driver circuit 150 to operate substantially simultaneously, whereas in other embodiments the overlaps may be different, thus staggering the driving of the output node OUT by the main driver circuit 120 and the equalizer driver circuit 150. Staggering the driving of the output node OUT in this manner may, in some examples, improve the slew rate and/or reduce overall or peak power consumption. In any event, the overlap between the second feedback control signal EQFB and the transition control signals EQ, EQF may provide the edge information for a signal transition, which may be used by the equalizer driver circuit 150 to control the boosting of the output node OUT.

FIG. 3B illustrates another example 150B of an equalizer driver circuit 150 for use in the transmitter circuit 102 of FIG. 1, according to an embodiment of the invention. The embodiment 150B of the equalizer driver circuit illustrated in FIG. 3B is similar to the embodiment 150A illustrated in FIG. 3A, except that the nFET 154 in FIG. 3A has been replaced with a pFET 164, thus allowing a single transition control signal EQ to be provided by the pre-driver circuit 110 to the equalizer driver circuit 150B.

Figure 4:
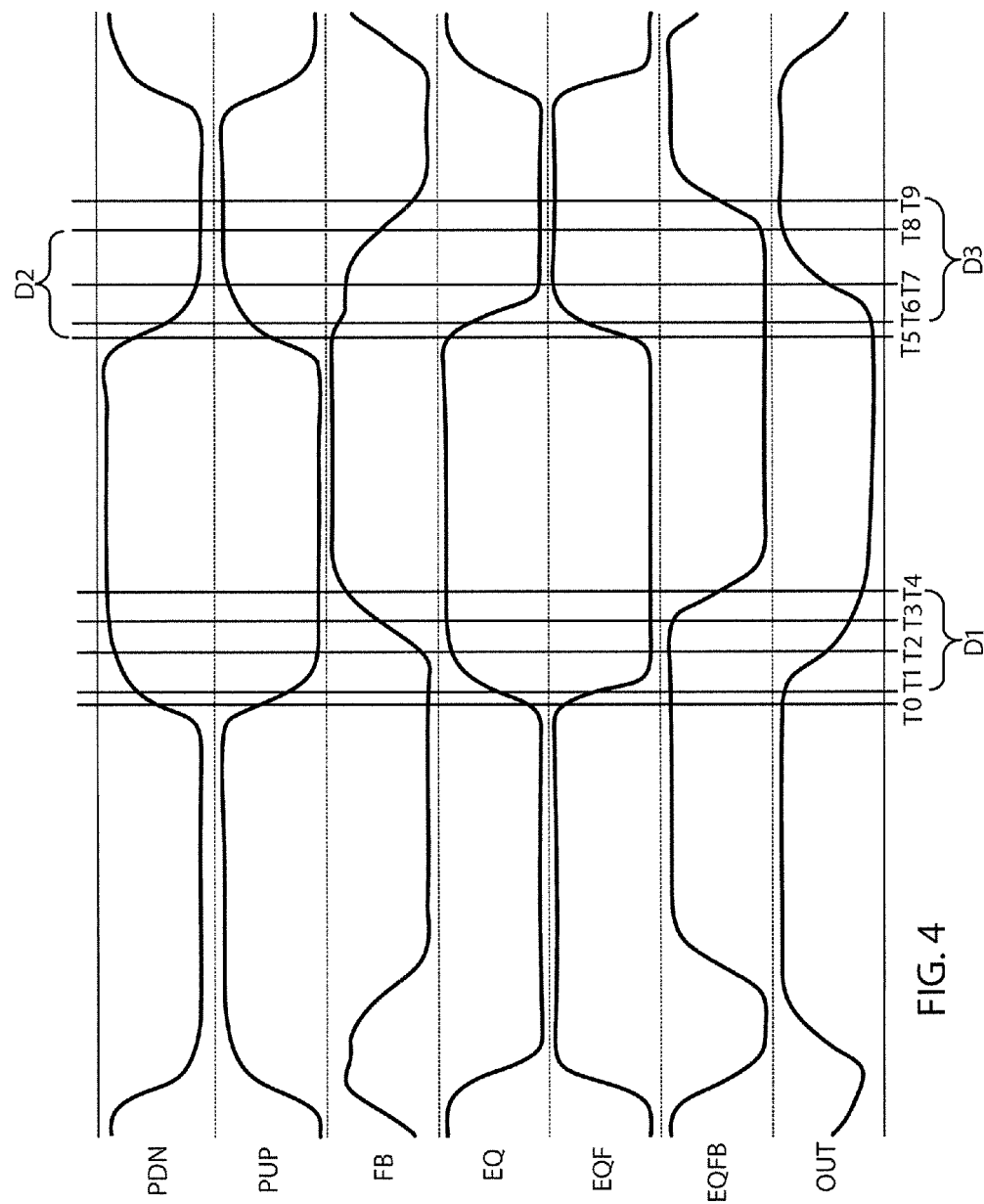
FIG. 4 is a simplified timing diagram for the transmitter circuit of FIG. 1 according to an embodiment of the present invention.

FIG. 4 illustrates a simplified timing diagram of the transmitter circuit 102 in FIG. 1 according to an embodiment of the invention. In particular, the simplified timing diagram in FIG. 4 illustrates the use of the embodiment of the main driver circuit 120A illustrated in FIG. 2A and the embodiment of the equalizer driver circuit 150A illustrated in FIG. 3A, although it will be understood that any other embodiment of the main driver circuit 120 and equalizer driver circuit 150 may be used in the transmitter circuit 102, in which case the timing diagram may or may not be different from that illustrated in FIG. 4.

In operation, at time T0, the transition control signal PDN provided by the pre-driver circuit 110 transitions to logic high, and the transition control signal PUP also provided by the pre-driver circuit 110 transitions to logic low, thus signaling that the output node OUT needs to be driven to logic low (e.g., 0 volts). Referring to FIG. 2A, nFET 126 becomes conductive as a result of transition control signal PDN transitioning to logic high, whereas nFET 124 becomes non-conductive as a result of transition control signal PUP transitioning to logic low. At time T1, the transition control signal EQ provided by the pre-driver circuit 110 transitions to logic high, and the transition control signal EQF also provided by the pre-driver circuit 110 transitions to logic low. Thus at time T1, nFET 156 becomes conductive as a result of transition control signal EQ transitioning to logic high, and nFET 154 becomes non-conductive as a result of transition control signal EQF transitioning to logic low. As a result of the pull-down networks of the main driver circuit 120 and equalizer driver circuit 150 being activated (i.e., as a result of nFET 126 and nFETs 156, 158 becoming conductive), charge stored on the output node OUT is discharged through the respective pull-down networks to the reference voltage node, such as ground, thus driving the output node OUT to a logic low (e.g., 0 volts).

At time T2, the output node OUT transitions from logic high to logic low, thus causing the first feedback control signal FB to transition from logic low to logic high at time T3 and also causing the second feedback control signal EQFB to transition from logic high to logic low at time T4. At time T4, the nFET 158 becomes non-conductive, thus de-activating the pull-down network of the equalizer driver circuit 150A. The pFET 152 becomes conductive at time T4, but the pull-up network is inactive at time T4 because the transition control signal EQF is provided as logic low at that time. In the main driver circuit 120A, the output node OUT stays coupled to the reference voltage node, such as ground, beginning at time T0 until time T5, as a result of nFET 126 remaining conductive based on receiving a logic high transition control signal PDN.

In this manner, the voltage of the output node (via the second feedback control signal EQFB) is used together with the transition control signals EQ, EQF to control the operation of the equalizer driver circuit 150A—i.e., the overlap of the transition control signal EQ and the second feedback control signal EQFB both being provided as logic high, during the duration D1, activates the pull-down network of the equalizer driver circuit 150 in order to provide a boost to assist the main driver circuit 120A in driving the output node OUT to a logic low.

At time T5, the transition control signal PDN provided by the pre-driver circuit 110 transitions to logic low, and the transition control signal PUP also provided by the pre-driver circuit 110 transitions to logic high, thus signaling that the output node OUT needs to be driven to logic high (which may be only a fraction of the voltage supply VCC, for example, it may be 0.2 volts when VCC is 1.2 volts). Referring to FIG. 2A, nFET 126 becomes non-conductive as a result of transition control signal PDN transitioning to logic low, whereas nFET 124 becomes conductive as a result of transition control signal PUP transitioning to logic high. Also, at time T5, the first feedback control signal FB continues to be provided as logic high. At time T6, the transition control signal EQ provided by the pre-driver circuit 110 transitions to logic low, and the transition control signal EQF also provided by the pre-driver circuit 110 transitions to logic high. Thus at time T6, nFET 156 becomes non-conductive as a result of transition control signal EQ transitioning to logic low, and nFET 154 becomes conductive as a result of transition control signal EQF transitioning to logic high. Also, at time T6, the second feedback control signal EQFB continues to be provided as logic low. As a result of the pull-up networks of the main driver circuit 120 and equalizer driver circuit 150 being activated (i.e., as a result of nFETs 122, 124, 154 and pFET 152 becoming conductive), charge flows from the voltage supply node VCC to the output node OUT, thus driving the output node OUT to a logic high (e.g., 0.2 volts).

At time T7, the output node OUT transitions from logic low to logic high, thus causing the first feedback control signal FB to transition from logic high to logic low at time T8 and also causing the second feedback control signal EQFB to transition from logic low to logic high at time T9. At time T9, the pFET 152 becomes non-conductive, thus de-activating the pull-up network of the equalizer driver circuit 150A. The nFET 158 becomes conductive at time T9, but the pull-down network is also inactive at time T9 because the transition control signal EQ is provided as logic low at that time. Thus, the overlap of the first feedback control signal FB and the transition control signal PUP both being provided as logic high, during the duration D2, activates the pull-up network of the main driver circuit 120 in order to provide the main driving of the output node OUT to a logic high, whereas the overlap of the transition signal EQF being provided as logic high with the second feedback control signal EQFB being provided as logic low, during the duration D3, activates the pull-up network of the equalizer driver circuit 150 in order to provide a boost to assist the main driver circuit 120 in driving the output node OUT to a logic high.

Figure 5:
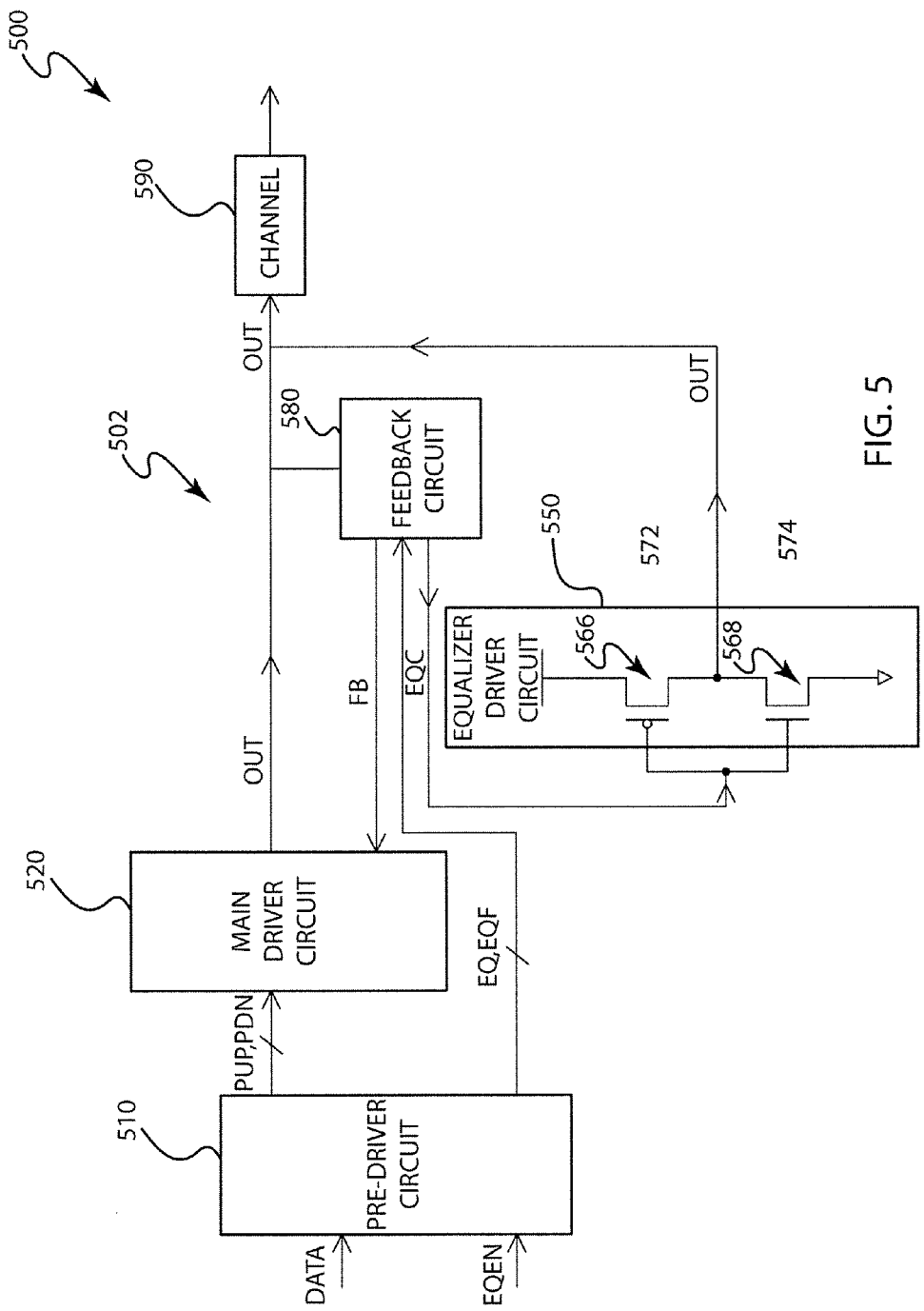
FIG. 5 is a simplified block and schematic diagram of an apparatus with a transmitter circuit according to an embodiment of the present invention

FIG. 5 illustrates an apparatus 500 with another embodiment 502 of a transmitter circuit, according to the present invention. The transmitter circuit 502 illustrated in FIG. 5 is similar to the transmitter circuit 102 illustrated in FIG. 1, except that the pre-driver circuit 510 in FIG. 5 provides the transition control signals EQ, EQF to the feedback circuit 580, instead of to the equalizer driver circuit 550. The feedback circuit 580 may in turn provide a combined feedback and transition control signal EQC to the equalizer driver circuit 550, which allows the equalizer driver circuit 550 to be simplified. For example, the equalizer driver circuit 550 could have a pFET 566 as its pull-up network and an nFET 568 as its pull-down network, both of which may receive the combined feedback and transition signal EQC. In another embodiment, the pull-up network of the equalizer driver circuit 550 may include an nFET, in which case two different combined feedback and transition control signals may be provided to the equalizer driver circuit 550.

Figure 6:
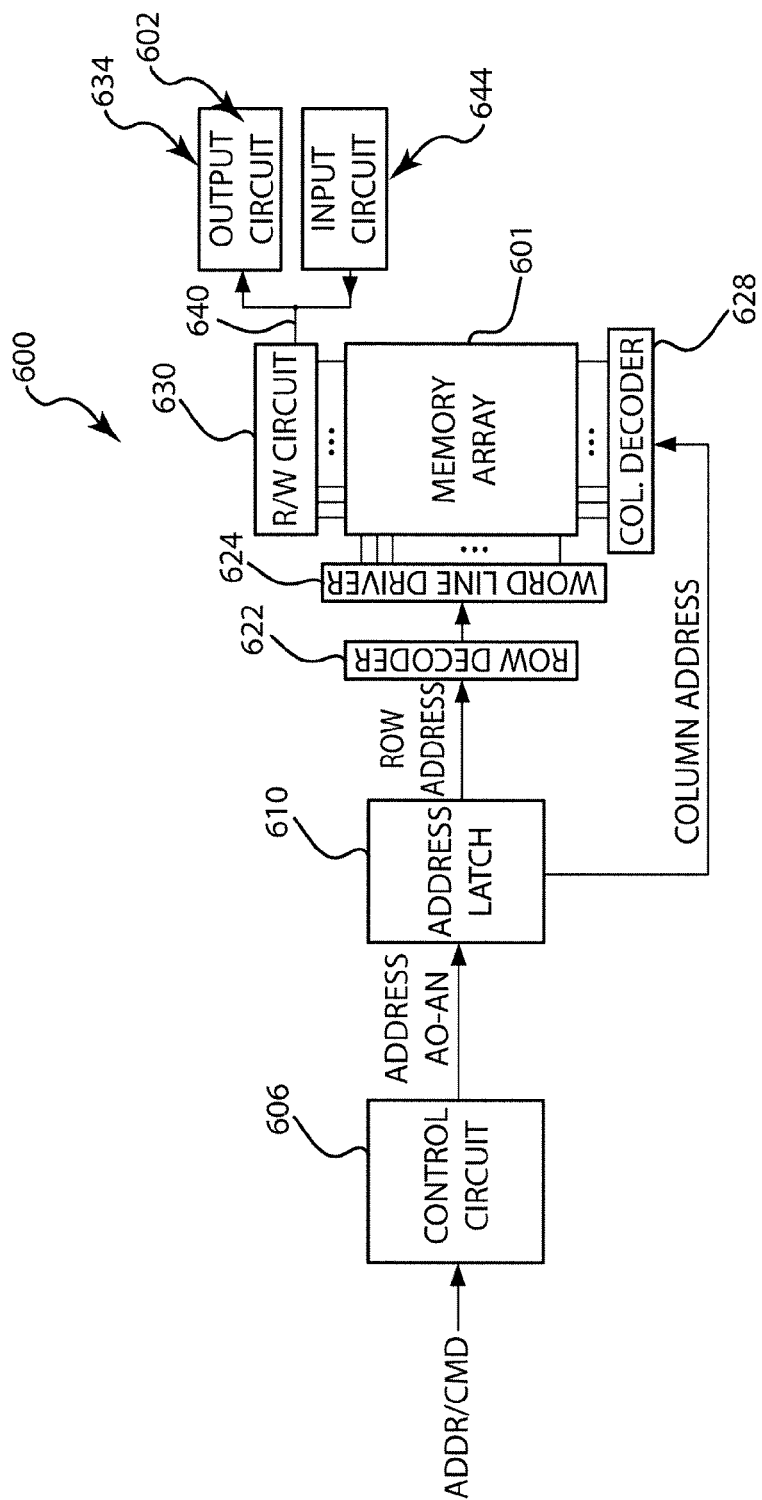
FIG. 6 is a block diagram of a memory according to an embodiment of the invention.

FIG. 6 illustrates a memory 600 according to an embodiment of the present invention. The memory 600 includes an array 601 of memory cells, which may be, for example, volatile memory cells (e.g., DRAM memory cells, SRAM memory cells), non-volatile memory cells (e.g., flash memory cells), or some other types of memory cells. The memory 600 includes a control circuit 606 that receives memory commands and addresses through an ADDR/CMD bus. The control circuit 606 provides control signals, based on the commands received through the ADDR/CMD bus. The control circuit 606 also provides row and column addresses to the memory 600 through an address bus and an address latch 610. The address latch then outputs separate column addresses and separate row addresses.

The row and column addresses are provided by the address latch 610 to a row address decoder 622 and a column address decoder 628, respectively. The column address decoder 628 selects bit lines extending through the array 601 associated with respective column addresses. The row address decoder 622 is connected to word line driver 624 that activates respective rows of memory cells in the array 601 associated with received row addresses. The selected data line (e.g., a bit line or bit lines) associated with a received column address are coupled to a read/write circuit 630 to provide read data to a data output circuit 634 via an input-output data bus 640. Write data are provided to the memory array 602 through a data input circuit 644 and the memory array read/write circuit 630. The control circuit 606 responds to memory commands and addresses provided to the ADDR/CMD bus to perform various operations on the memory array 601. In particular, the control circuit 606 is used to provide internal control signals to read data from and write data to the memory array 601. In some embodiments, the output circuit 634 may include a transmitter circuit 602, which may be similar to the transmitter circuits 102, 502 described above.

Figure 7:
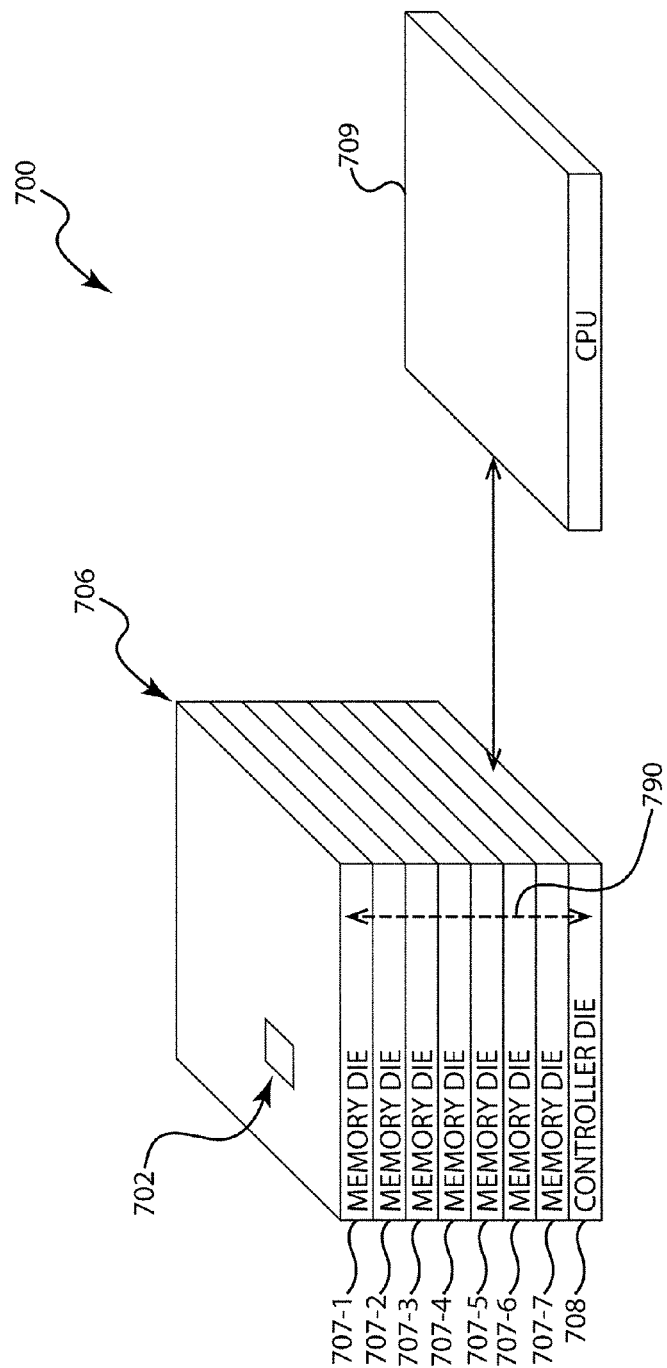
FIG. 7 is a simplified perspective view of a hybrid memory system according to an embodiment of the invention.

FIG. 7 illustrates a memory system 700, according to an embodiment of the invention. The memory system 700 includes a central processing unit CPU 709 and a memory cube 706. The memory cube 706 further includes a plurality of memory dies 707-1, 707-2, 707-3, 707-4, 707-5, 707-6, 707-7 and a controller die 708. Each of the plurality of memory dies 707-1, 707-2, 707-3, 707-4, 707-5, 707-6, 707-7 may be a DRAM memory die, similar to the memory 600 illustrated in FIG. 6, and each memory die 707-1, 707-2, 707-3, 707-4, 707-5, 707-6, 707-7 may include a transmitter circuit 702 with a main driver circuit and an equalizer driver circuit, similar to the transmitter circuits 102, 502 described above.

A channel 790 may be formed between the memory die 707-1, 707-2, 707-3, 707-4, 707-5, 707-6, 707-7 and the controller die 708. The channel 790 may, for example, include a plurality of TSVs in respective memory dies 707-1, 707-2, 707-3, 707-4, 707-5, 707-6, 707-7, and the transmitter circuits 702 may provide data to the channel 790 for transmission to the controller die 708. As mentioned above, the equalizer driver circuit of each transmitter circuit 702 may assist the main driver circuit of the transmitter circuit 702 in order to compensate for distortions (such as high frequency losses) of data transmitted to the controller die 708 through the channel 790.

From the foregoing it will be appreciated that, although specific embodiments of the invention have been described herein for purposes of illustration, various modifications may be made without deviating from the spirit and scope of the invention. For example, FIGS. 1 and 5 illustrate embodiments of a transmitter circuit 102, 502, FIGS. 1, 2A-2D, and 5 illustrate embodiments of main driver circuits 120, 120A, 120B, 120C, 120D, 520, FIGS. 1, 3A-3B, and 5 illustrated embodiments of equalizer driver circuits 150, 150A, 150B, 550, and so forth. However, other transmitter circuits, main driver circuits, equalizer driver circuits, and so forth may be used, which are not limited to having the same design, and may be of different designs and include circuitry different from the circuitry in the embodiments illustrated in the figures.

For example, the equalizer driver circuits 150, 150A, 150B, 550 may in some embodiments be segmented, similar to the segmentation of the main driver circuit 120E in FIG. 2B, in order to improve the drive strength, improve the clock slew, and so forth. As another example, while the main driver circuits 120A, 120B, 120C, 120D are examples of small-swing, ground referenced driver circuits, small-swing voltage supply referenced driver circuits may be used in other embodiments. As still another example, in some embodiments, one or both of the feedback control signals FB, EQFB may be provided to the pre-driver circuit 110, which may then provide the transition control signals PUP, PDN, EQ, EQF responsive not only to the input signal DATA but also to one or both of the feedback control signals FB, EQFB.

Accordingly, the invention is not limited to the specific embodiments of the invention described herein.

What is claimed is:

1. An apparatus, comprising:
a pre-driver circuit configured to provide first and second transition control signals responsive to received data;
a main driver circuit configured to drive an output node responsive to the first transition control signal;
a feedback circuit configured to provide first and second feedback control signals responsive to a voltage of the output node reaching or exceeding a threshold; and
an equalizer driver circuit configured to assist the main driver circuit in driving the output node responsive to the second transition control signal and not assist the main driver circuit in driving the output node responsive to the second feedback control signal.

2. The apparatus of claim 1, wherein the main driver circuit being configured to drive an output node responsive to the transition control signal comprises the main driver circuit being configured to drive the output node responsive to the transition control signal and the first feedback control signal, and wherein the equalizer driver circuit being configured to assist the main driver circuit in driving the output node responsive to signals from at least one of the pre-driver circuit and the feedback circuit comprises the equalizer driver circuit being configured to assist the main driver circuit in driving the output node responsive to signals from the pre-driver circuit and the feedback circuit.

3. The apparatus of claim 1, wherein the main driver circuit is a small swing, ground-referenced driver circuit.

4. The apparatus of claim 1, wherein the equalizer driver circuit is configured to be enabled and disabled.

5. The apparatus of claim 1, wherein the main driver circuit and the equalizer driver circuit together form a transmitter circuit of a first DRAM memory die, the apparatus further comprising a plurality additional DRAM memory dies and a controller die.

6. The apparatus of claim 5, wherein the transmitter is configured to transmit data from the first DRAM memory die to the controller die through a plurality of through silicon vias in respective additional DRAM memory dies, the equalizer driver circuit being configured to compensate for distortions of data transmitted to the controller die.

7. An apparatus, comprising:
a pre-driver circuit configured to provide a transition control signal responsive to received data;
a main driver circuit configured to drive an output node responsive to the transition control signal;
a feedback circuit configured to provide a first feedback control signal responsive to a voltage of the output node reaching or exceeding a threshold and provide a second feedback control signal, wherein the feedback circuit is configured to invert the first feedback control signal in order to provide the second feedback control signal; and
an equalizer driver circuit configured to assist the main driver circuit in driving the output node responsive to a transition control signal from the pre-driver circuit and the second feedback control signal from the feedback circuit.

8. An apparatus, comprising:
a pre-driver circuit configured to provide a transition control signal responsive to received data;
a main driver circuit configured to drive an output node responsive to the transition control signal;
a feedback circuit configured to provide a feedback control signal responsive to a voltage of the output node reaching or exceeding a threshold; and
an equalizer driver circuit configured to assist the main driver circuit in driving the output node responsive to signals from at least one of the pre-driver circuit and the feedback circuit, wherein the equalizer driver circuit is configured to be enabled and disabled and wherein the transition control signal is a first transition control signal and the pre-driver circuit is configured to provide a second transition control signal to the equalizer driver circuit responsive to an equalizer enable signal.

9. An apparatus, comprising:
a feedback circuit configured to provide first and second feedback control signals responsive to a voltage of a node;
a pre-driver circuit is configured to provide a first transition control signal to the feedback circuit and provide a second transition control signal;
a main driver circuit configured to drive the node based at least in part on the first feedback control signal; and
an equalizer circuit configured to provide additional current and/or voltage to the node during a data transition responsive to the second transition control signal from the pre-driver circuit and stop providing additional current and/or voltage to the node responsive to the second feedback control signal.

10. The apparatus of claim 9, wherein the equalizer circuit comprises a pull-up network and a pull-down network.

11. The apparatus of claim 10, wherein the pull-up network comprises a pFET and an nFET.

12. The apparatus of claim 10, wherein the pull-up network comprises a single pFET.

13. An apparatus, comprising:
a feedback circuit configured to provide first and second feedback control signals responsive to a voltage of a node;
a main driver circuit configured to drive the node based at least in part on the first feedback control signal; and
an equalizer circuit configured to provide additional current and/or voltage to the node during a data transition responsive to the second feedback control signal, wherein a drive strength of the equalizer circuit is no more than 20% of a drive strength of the main driver.

14. A method, comprising:
providing output data to a channel using a main driver based on data received from an array;
providing a transition control signal based on the data received from the array;
providing a first feedback control signal to the main driver based on a voltage of an output node of the main driver; and compensating for transmission effects in the channel using an equalizer circuit controlled at least in part by a second feedback control signal and the transition control signal, wherein the second feedback control signal is the inverse of the first feedback control signal.

15. The method of claim 14, wherein the first and second feedback control signals are both provided by a feedback circuit coupled to the output node of the main driver.

16. The method of claim 14, wherein the transition control signal is provided a pre-driver circuit responsive to the data received from the array.

17. A method, comprising:
  providing output data to a channel using a main driver based on data received from an array;
  providing a first feedback control signal to the main driver based on a voltage of an output node of the main driver;
  compensating for transmission effects in the channel using an equalizer circuit controlled at least in part by a second feedback control signal; and
  determining an edge of a data transition based at least in part on the second feedback control signal.

18. The method of claim 17, wherein the equalizer circuit is coupled to the output node of the main driver and the equalizer circuit compensates for high frequency losses in the channel by boosting transitions in the output data responsive to the determined edge of the data transition.

* * * * *